United States Patent

[11] 3,609,473

[72] Inventors Charles A. Bittmann
Los Altos;
Gary W. Parker, Los Gatos, both of Calif.
[21] Appl. No. 854,422
[22] Filed Sept. 2, 1969
[45] Patented Sept. 28, 1971
[73] Assignee Fairchild Camera and Instrument Corporation
Mount View, Calif.

[54] TWO-LAYER METALLIZED HIGH FREQUENCY TRANSISTOR EMPLOYING EXTENDED CONTACTS TO SHIELD INPUT TERMINAL FROM OUTPUT TERMINAL AND MOUNTED IN A COAXIAL CABLE
1 Claim, 2 Drawing Figs.

[52] U.S. Cl. .......... 317/234 R, 317/235 R, 317/234 G, 317/234 M, 317/234 N, 317/235 Y, 317/235 Z, 317/235 AH, 333/12, 333/13, 333/7
[51] Int. Cl. .......... H01l 3/00, H01l 5/00
[50] Field of Search .......... 333/7, 12, 13; 317/234, 235, 40.12, 40.13, 46.1, 4, 5, 5.4, 22, 22.1, 22.11, 46.1

[56] References Cited
UNITED STATES PATENTS

| | | | |
|---|---|---|---|
| 3,287,612 | 11/1966 | Lepselter | 317/235 |
| 3,310,717 | 3/1967 | Hargasser et al. | 317/234 |
| 3,381,183 | 4/1968 | Turner et al. | 317/234 |
| 3,461,357 | 8/1969 | Mutter et al. | 317/234 |
| 3,461,550 | 8/1969 | Aklufi | 317/235 X |
| 3,237,271 | 3/1966 | Arnold et al. | 317/235 |
| 3,465,210 | 9/1969 | Bertram et al. | 317/234 |

FOREIGN PATENTS

| | | | |
|---|---|---|---|
| 954,534 | 4/1964 | Great Britain | 317/235 |

*Primary Examiner*—John W. Huckert
*Assistant Examiner*—Andrew J. James
*Attorneys*—Roger S. Borovoy and Alan H. Macpherson

ABSTRACT: The base and emitter contacts to a high frequency transistor are formed of two separate layers of metallization separated by an intervening dielectric. Either the base or the emitter lead is formed into a circular beam diaphragm, portions of which extend beyond the semiconductor chip. This circular lead mates around its external edge with an internal diaphragm in a coaxial package to form either the base or emitter connection to the transistor.

INVENTORS
CHARLES A. BITTMANN
GARY W. PARKER
Alan H. MacPherson
ATTORNEY

TWO-LAYER METALLIZED HIGH FREQUENCY TRANSISTOR EMPLOYING EXTENDED CONTACTS TO SHIELD INPUT TERMINAL FROM OUTPUT TERMINAL AND MOUNTED IN A COAXIAL CABLE

BACKGROUND OF THE INVENTION

1. Field of the Invention

This invention relates to high frequency transistors and in particular to a transistor structure which greatly reduces the input-output parasitic capacitance of such transistors and, at the same time, produces low inductance RF connections.

2. Prior Art

In the frequency range above 1 gHz., transistors are commonly operated in the common-base mode because in this configuration it is possible to neutralize part of the collector-base capacitance. To increase power output at these high frequencies, the transistor structure usually consists of many discrete emitters connected in parallel. This parallel connection of emitters decreases the likelihood that any one emitter region will draw excessive current resulting in "hot spot" formation and transistor burnout. Multiple emitter transistors are well known in the art and almost universally employed above 1 GHZ. Unfortunately, transistors using discrete emitters typically have high parasitic capacitance between the collector and the emitter.

Moreover, the leads attached to the emitter regions are usually interdigitated with the leads attached to the base region; that is, the base and emitter leads comprise alternating thin fingerlike extensions in the same plane to the emitter and base contacts. Capacitive coupling between base and emitter contacts is thus common. Finally, the inductance of leads is inversely proportional to their width. Because the interdigitated leads are usually narrow, inductive effects become large at high frequencies.

SUMMARY OF THE INVENTION

This invention, on the other hand, overcomes these disadvantages of prior art high frequency transistors by providing emitter and base leads of minimum inductance. Consequently, the leads of this invention reduce parasitic inductance to negligible proportions. Moreover, the leads of this invention are particularly suitable for encapsulating the resulting solid-state device in a coaxial package in such a manner as to almost completely isolate the input and output circuits.

According to this invention, the base and emitter contacts to a multiple-emitter high frequency transistor are formed of two separate layers of metallization separated by an intervening dielectric. Either the base or the emitter lead is formed into a circular beam diaphragm, portions of which extend beyond the semiconductor chip. Furthermore, this circular lead mates around its external edge with an internal diaphragm in a coaxial package to form either the base or emitter connection to the solid-state device. This connection is typically to the common lead of the coaxial package.

A further advantage of the circular lead contact of this invention is the use of the lead itself as a heat conduction path. The large circular emitter or base lead serves as an excellent heat sink, heat conductor, and heat radiator, making possible larger power dissipation in the attached semiconductor die.

Finally, because it is not necessary to interdigitate the emitter and base conductors in one plane, the emitter current conduction path is greatly simplified over this path in prior art devices.

This invention will be more fully understood in light of the following detailed description together with the drawings.

DETAILED DESCRIPTION OF THE DRAWINGS

Figure 1:
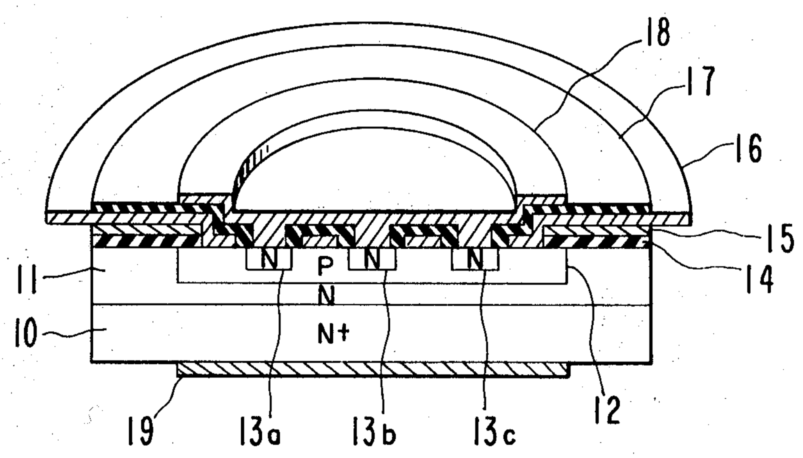
Figure 2:
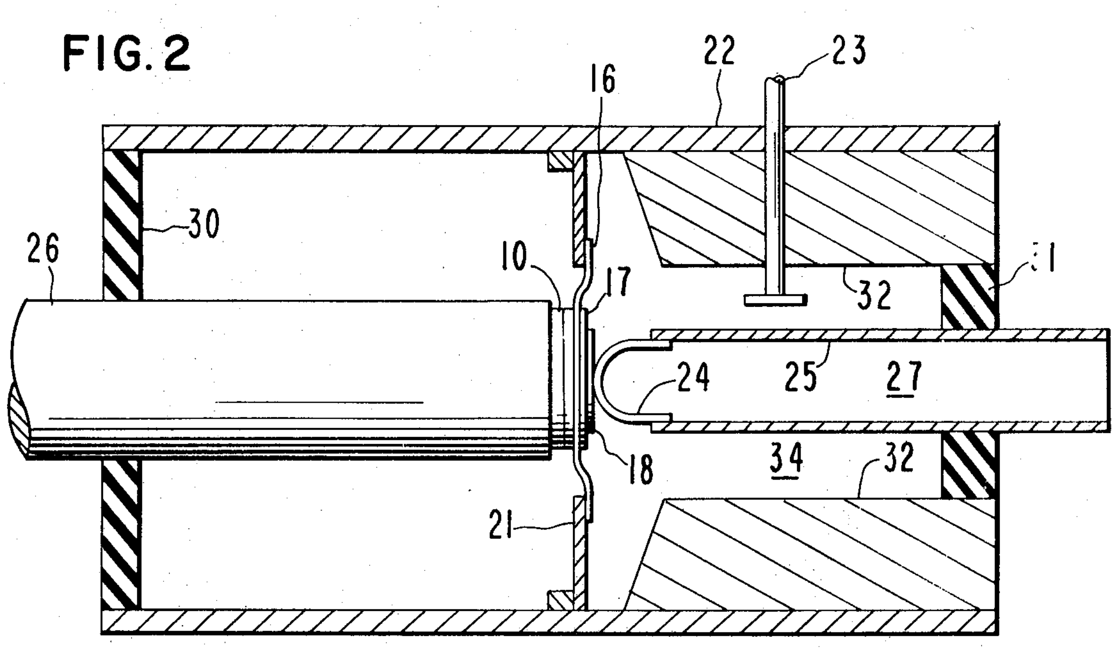

FIG. 1 shows an isometric cross-sectional view of a transistor using the lead structure of this invention; and FIG. 2 shows a transistor containing the lead structure of this invention mounted in a coaxial conductor with grounded base connector.

DETAILED DESCRIPTION OF THE INVENTION

FIG. 1 shows the transistor of this invention in isometric cross-sectional view. A silicon wafer 10 containing an $N^+$-type impurity concentration of around $10^{18}$ atoms/cm.$^3$ has grown on it a thin epitaxial region 11 containing an N-type impurity concentration of around $10^{16}$ impurity atoms/cm.$^3$. Epitaxially grown region 11 is then thermally oxidized in a manner well known in the silicon-processing arts to produce oxide layer 14. A base diffusion window is next cut through oxide layer 14 by normal photolithographic techniques. These techniques are well known in the semiconductor arts and thus will not be described in detail.

Next, a base diffusion is carried out in epitaxial layer 11 using a P-type dopant such as boron. Such base diffusion techniques are also well known in the semiconductor processing arts and thus will not be described in detail. A typical acceptor impurity concentration in the resulting diffused base region 12 is $10^{17}$ atoms/cm.$^3$.

Either during or following base diffusion, a second oxide layer 15 is grown on the surface of base region 12 and the remaining portions of oxide layer 14 and windows are cut through this layer to form an emitter diffusion pattern. These windows are cut by well known photolithographic techniques. While layer 15 is preferably silicon dioxide, this layer might also be silicon nitride instead of silicon dioxide.

Emitter diffusions are carried out through the windows in layer 15 to produce emitter regions **13*a*, 13*b*, and 13*c* within base region 12**. Typical impurity concentrations of these emitter regions are from $10^{19}$ to $10^{20}$ atoms/cm.$^3$. While only three emitter regions are shown in FIG. 1, the number of emitter regions diffused can be varied as desired.

The base width between the bottom of emitter regions 13 and the PN junction between base region 12 and collector region 11 is typically one-quarter micron.

Those portions of oxide layers 14 and 15 over base region 12 are next etched away to expose large portions of the surface area of base region 12.

So far the steps described are typically those steps used in forming a high frequency transistor for operation in the gHz. frequency range. In accordance with this invention, however, the techniques now to be described for forming the base and emitter lead patterns are novel and result in improved transistor performance.

Accordingly, metal layer 16 is now evaporated over the entire surface of the water, particularly over dielectric layer 15 and over portions of the tops of base region 12 and emitter regions **13*a*, 13*b* and 13*c*. Metal evaporation techniques are well known and thus will not be described in detail. Masking next allows the metal over the emitter regions and a small perimeter surrounding the emitter regions to be removed. The distance from the emitter to the edge of the perimeter at which metal is left is of the order of 2 microns. Metal layer 16 can be any metal having adequate adherence to the underlying dielectric 15** so that a beam lead type of structure can result. This metal can be either pure aluminum or a complex platinum, titanium, or gold structure. If the latter composite metal structure is used, an additional titanium top layer is required.

Metal layer 16, which contacts base region 12 at all points except where emitter regions **13*a*, 13*b*, 13*c* and their surrounding perimeters exist, has a circular shape as shown in FIG. 1. Over metal layer 16 is next formed a second dielectric layer 17. Layer 17** is typically an oxide of silicon.

Layer 17 may be sputtered or evaporated using techniques now well known in the art. Holes through layer 17 are next etched using photolithographic masking techniques to provide contact to the emitter regions. Alternatively, the oxide over the emitter regions can be lifted and an emitter wash used to expose the emitter regions. Finally, a second layer 18 of metal is applied to the structure and etched to provide emitter metal through the cuts in layer 17 to connect to all the individual emitters. The resulting lead structure consists of a first circular metal disc attached to the base region 12 and a second layer of contact metal attached to the underlying emitter regions 13, however many there may be.

Wafer 10 with its overlying metal and insulation layers is now masked on its backside and etched so that the base contact resembles a radial beam extending beyond the edge of the die. The die can be any desired shape; but to illustrate this invention, a round cylindrical shape concentric with the final disc-shaped radial beam structure is shown.

The structure shown in FIG. 1 consists of the radially extended beam-base contact 16 and the metal emitter contact 18 separated from the base contact 16 by dielectric layer 17. The base contact is disc shaped. As the base contact covers the majority of the surface except for the emitter regions, the base contact almost completely isolates the input from the output lead.

The die with attached lead structure can now be mounted in a coaxial package as shown in FIG. 2. FIG. 2 shows a cross-sectional view of a circular coaxial cable. Wafer 10 is mounted in the center of the coaxial cable with its base lead 16 extending toward and in contact with annular-shaped diaphragm 21 attached to the common shield 22 of the coaxial cable. On top of base lead 16 is shown dielectric layer 17. Emitter lead 18 then is contacted by spring contact 24 attached to the input lead 25 to, for example, a 50-ohm coaxial line or as shown, a microwave waveguide. Tuning stub 23 allows the cutoff frequency of waveguide 27 to be adjusted or the resonant frequency of cavity 34 to be tuned when this waveguide is used as a microwave oscillator. The collector contact to wafer 10, formed on the back side of the wafer shown in FIG. 1 and labeled 19, is attached to the conductor 26 of the output of this circuit. The external housing 22 of the coaxial cable is grounded. Both internal conductors are isolated from the remainder of the cable by disc-shaped dielectric materials 30 and 31. Material 32 lining the inside of the right half of the coaxial cable is a conductive material used to achieve the desired microwave cutoff frequency.

While the structure shown in FIG. 2 uses a transistor in the common base configuration, it should be understood that the transistor of this invention can, if desired, have a disc-shaped emitter lead connected to ground with the base lead forming the input to the transistor. When this is done, the first layer of metallization 16 will contact the emitter regions rather than the base regions, while the second layer 18 of metallization will contact the base region. Thus, the extended beam contact is an emitter contact which then will extend to and mate with diaphragm 21.

What is claimed is:

1. A structure comprising a high frequency transistor mounted in a coaxial cable, said high frequency transistor containing collector base and emitter regions and contacts to each region, the contact to said base region comprising a first layer of metal overlying a layer of insulation and contacting a surface of said base region, said first layer of metal extending beyond the semiconductor die in which said transistor is formed and possessing a disc shape which shields the emitter terminal from the collector terminal and prevents feedback capacitance between the emitter terminal and the collector terminal; and the contacts to said emitter regions comprising a second layer of metal overlying but insulated from said first layer, said second layer contacting the surfaces of the emitter regions of said transistor; said high frequency transistor being mounted in said coaxial cable with said second layer of metal connected to one lead from the coaxial cable, and with said first layer of metal extending toward and contacting an annular-shaped diaphragm attached to the common shield of said coaxial cable, and the collector region of said transistor being connected to a second lead from said coaxial cable.